(12) United States Patent
Jung et al.

(10) Patent No.: US 7,807,565 B2
(45) Date of Patent: Oct. 5, 2010

(54) METHOD OF FORMING BIT LINE OF FLASH MEMORY DEVICE

(75) Inventors: Woo Yung Jung, Seoul (KR); Tae Kyung Kim, Icheon-si (KR); Eun Soo Kim, Incheon (KR)

(73) Assignee: Hynix Semiconductor Inc., Icheon-si (KR)

(*) Notice: Subject to any disclaimer, the term of this patent is extended or adjusted under 35 U.S.C. 154(b) by 151 days.

(21) Appl. No.: 11/439,527

(22) Filed: May 22, 2006

(65) Prior Publication Data
US 2006/0270212 A1     Nov. 30, 2006

(30) Foreign Application Priority Data
May 23, 2005     (KR) .............. 10-2005-0043250

(51) Int. Cl.
*H01L 21/4763* (2006.01)
*H01L 23/12* (2006.01)

(52) U.S. Cl. ............. 438/620; 438/622; 257/700; 257/758; 257/774; 257/E21.577

(58) Field of Classification Search ............. None
See application file for complete search history.

(56) References Cited

U.S. PATENT DOCUMENTS

| | | | |
|---|---|---|---|
| 6,069,383 A | 5/2000 | Yu | |
| 6,121,086 A * | 9/2000 | Kuroda et al. | 438/256 |
| 7,291,556 B2 * | 11/2007 | Choi et al. | 438/672 |
| 2003/0216001 A1 | 11/2003 | Lee et al. | |
| 2004/0051133 A1 | 3/2004 | Sugita et al. | |
| 2004/0161881 A1 | 8/2004 | Shin et al. | |
| 2004/0219729 A1 | 11/2004 | Kang | |
| 2005/0224854 A1 * | 10/2005 | Park | 257/296 |

FOREIGN PATENT DOCUMENTS

CN      1133491      10/1996

* cited by examiner

*Primary Examiner*—Alonzo Chambliss
(74) *Attorney, Agent, or Firm*—Townsend and Townsend and Crew LLP

(57) ABSTRACT

A method for forming a semiconductor device includes forming drain contact holes in a first interlayer insulating layer provided over a semiconductor substrate. First metal material is formed over the first interlayer insulating layer and fills the drain contact holes. A first metal layer formed by patterning the first metal material includes first lines and landing pads. Trenches formed in a second interlayer insulating layer formed over the patterned first metal material expose the landing pads. A second metal layer is formed by providing second metal material over the second interlayer insulating layer and filling the trenches. The second metal layer includes second lines within the trenches that contact the landing pads. The first and second metal layers define a first metal level of the semiconductor device. The first lines define odd-number lines of the first metal level, and the second lines define even-number lines of the first metal level.

14 Claims, 6 Drawing Sheets

METHOD OF FORMING BIT LINE OF FLASH MEMORY DEVICE

BACKGROUND

The present invention relates to a method of fabricating semiconductor devices, and more particularly, to a method of forming bit lines of a flash memory device.

In flash memory devices, the pattern size of lower elements is continuously being reduced. This reduction in pattern size can lead to crosstalk. To reduce the crosstalk problem, the space width of the oxide film is maximized. However, if the pitch of the metal line is reduced to obtain a higher capacity of the device, the space between the first metal lines M-1 also shrinks.

FIG. 1 is a cross-sectional view illustrating the problem with a reduction in pattern size between the bit lines of the flash memory device in the related art.

Referring to FIG. 1, metal films that generate the coupling capacitor adjacent to the bit line A include a lower word line W/L, bit lines B, C parallel to the bit line A, an upper metal line M2, and so on. The word line W/L and the bit line A are separated by a first interlayer insulating layer, but a first inter-capacitance C01 also exists therebetween.

Furthermore, the bit lines B, C adjacent to the bit line A are electrically separated by a second interlayer insulating layer, but second inter-capacitances C11 also exists therebetween. In addition, the bit line A and the upper metal line M2 are electrically separated by a third interlayer insulating layer. A third inter-capacitance C12 exists therebetween.

The coupling capacitor associated with the bit line A can be calculated as follows using the Sakurai Model. It is first assumed that the distance between the word line WL and the bit line B/L is D, the height of the bit line is T, the thickness of the bit line is W, the distance between adjacent bit lines is S, the distance between the bit line and the upper metal line is H, the first inter-capacitance is C01, the second inter-capacitance is C11, and the third inter-capacitance is C12.

$$\frac{C01}{\varepsilon ox} = 1.15 s(W/D) + 2.80(T/D)s0.222 - 0.07(T/D)s0.222s(S/D)s1.34$$

$$\frac{C11}{\varepsilon ox} = (0.03s(W/D) + 0.83(T/D))s(S/D) - 1.34$$

$$\frac{C12}{\varepsilon ox} = 1.15s(W/H) + 2.80(T/D)s0.222 - 0.07(T/D)s0.222s(S/H)s1.34$$

The total capacitance C that may be generated in the bit line by the first to third inter-capacitances according to Sakurai Model is C01+2C11+C12.

From the previous two equations, it can be seen that the thickness of the bit line and the distance between adjacent bit lines are important factors in the coupling capacitance.

That is, to reduce the bit line capacitance, the thickness (W) of the bit line can be reduced and the distance (S) between adjacent bit lines widened. However, if the thickness (W) of the bit line and the distance (S) between the bit lines are excessively reduced, the resistance of the bit line increases. It is therefore necessary to find an optimal condition considering these factors.

In recent years, the distance between the bit lines has narrowed due to higher integration of the flash memory device. Accordingly, there is a problem with increasing sensing time since the capacitance between the bit lines increases.

The term "sensing time" refers to the time it takes for the voltage of the bit line to change to the point that data in the latch circuit can be changed after performing the process of sensing variation in the voltage of the bit line when reading data and storing the read data in the page buffer in the NAND flash memory device. To improve the speed in the flash memory device, the sensing time should be reduced.

SUMMARY OF THE INVENTION

An embodiment of the present invention provides a method of forming bit lines of a flash memory device, wherein an increase in the capacitance of the bit lines can be prevented and the distance between the bit lines can also be minimized, thereby reducing the sensing time.

A method for forming a flash memory device according to an aspect of the present invention includes the steps of; (a) forming a first interlayer insulating layer on a semiconductor substrate in which semiconductor elements are formed, and then performing a patterning process to form drain contact holes, (b) forming a first metal material having a predetermined thickness on the first interlayer insulating layer and burying the drain contact holes with the first metal material at the same time, (c) patterning the first metal material to form first metal layers disposed at odd-numbered first metal lines and landing pads between the first metal layers, (d) forming a second interlayer insulating layer on the entire results in which the first metal layers and the landing pads are formed, and patterning the second interlayer insulating layer to form trenches through which the landing pads are exposed, and (e) burying the second metal material only within the trenches to form second metal layers disposed at even-numbered first metal lines, whereby the second metal layers disposed at the even-numbered first metal lines and the first metal layers disposed at the odd-numbered first metal lines are disposed in zigzags and spaced apart from each other.

The landing pads may be formed only at upper regions in which the drain contact plugs are formed so that they do not touch the adjacent first metal layers.

The patterning process for forming the first metal layers and the landing pads may be performed by Reactive Ion Etch.

Each of the trenches through which the landing pads are exposed may have a bottom Critical Dimension (CD) smaller than the top bottom CD.

The method may further include the step of forming metal line contact holes at given regions of the first interlayer insulating layer during the process of forming the drain contact holes.

When the first metal material is buried into the drain contact holes, the first metal material may be buried into the metal line contact holes.

The first metal material may be any one of Al, W, Cu, or TiN formed by CVD, and a polysilicon layer formed by a furnace method.

The second interlayer insulating layer may be any one of BPSG, PSG, FSG, PE-TEOS, PE-SiH$_4$, HDP USG, and APL oxide films.

A method for forming a flash memory device according to an aspect of the present invention includes the steps of; (a) forming a first interlayer insulating layer on a semiconductor substrate in which drain contact plugs have been formed, and patterning the first interlayer insulating layer to form trenches through which the drain contact plugs are exposed and in which first metal layers will be formed and trenches in which landing pads will be formed, (b) forming a first metal material only within the trenches in which the first metal layers will be formed and the trenches in which the landing pads will be formed, thereby forming the first metal layers disposed at odd-numbered first metal lines and landing pads, (c) forming a second interlayer insulating layer on the entire surface and patterning the second interlayer insulating layer to form trenches through which the landing pads are exposed and in which the second metal layers will be formed, and (d) burying a second metal material only within the trenches in which the second metal layers will be formed to form the second metal layers disposed at even-numbered first metal lines, whereby the second metal layers disposed at the even-numbered first metal lines and the first metal layers disposed at the odd-numbered first metal lines are disposed in zigzags and spaced apart from each other.

The landing pads may be formed only at upper regions in which the drain contact plugs are formed so that they do not touch adjacent first metal layers.

Each of the trenches through which the landing pads are exposed may have a bottom CD smaller than the top bottom CD.

A method of forming bit lines of a flash memory device according to another aspect of the present invention includes the steps of forming first metal layers disposed at odd-numbered first metal lines and landing pads on a semiconductor substrate, and forming second metal layers disposed at even-numbered first metal lines only on the landing pads, whereby the second metal layers disposed at the even-numbered first metal lines and the first metal layers disposed at the odd-numbered first metal lines are disposed in zigzags and spaced apart from each other.

In one embodiment, a method for forming a semiconductor device includes forming a plurality of drain contact holes in a first interlayer insulating layer provided over a semiconductor substrate. First metal material having a predetermined thickness is formed over the first interlayer insulating layer, the first metal material filling the drain contact holes. A first metal layer is formed by patterning the first metal material, the first metal layer having a plurality of lines of a first type and a plurality of landing pads. A second interlayer insulating layer is formed over the patterned first metal material. A plurality of trenches is formed in the second interlayer insulating layer, the trenches exposing the landing pads. A second metal layer is formed by providing second metal material over the second interlayer insulating layer and filling the trenches, the second metal layer including a plurality of lines of a second type defined within the trenches, the lines of the second type contacting the landing pads. The first and second metal layers define a first metal level of the semiconductor device. The lines of the first type define odd-number lines of the first metal level, and the lines of the second type define even-number lines of the first metal level.

BRIEF DESCRIPTION OF THE DRAWINGS

A more compete appreciation of the invention, and many of the advantages thereof, will be readily apparent and better understood with reference to the following detailed description in conjunction with the accompanying drawings in which like reference symbols indicate the same or similar components, wherein.

DETAILED DESCRIPTION OF EMBODIMENTS

In the following detailed description, only certain embodiments of the present invention have been shown and described simply by way of illustration. As those skilled in the art will realize, the described embodiments may be modified in various ways, all without departing from the spirit or scope of the present invention. When it is said that any part, such as a layer, film, area, or plate, is positioned on another part, it means the part is directly on the other part or above the other part with at least one intermediate part. On the other hand, if any part is said to be positioned directly on another part it means that there is no intermediate part between the two parts.

Figure 3A:
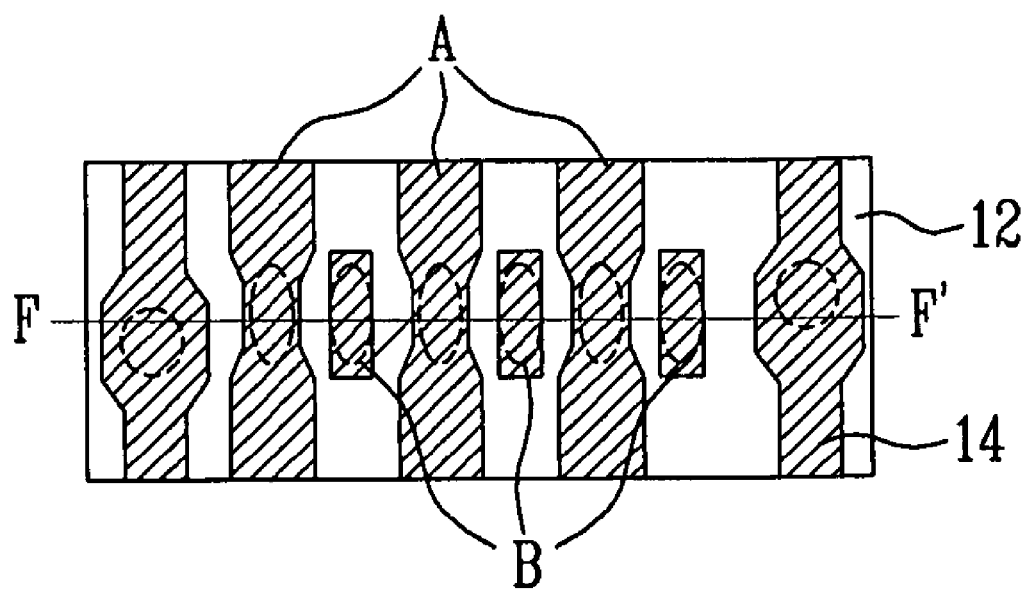
Figure 3B:
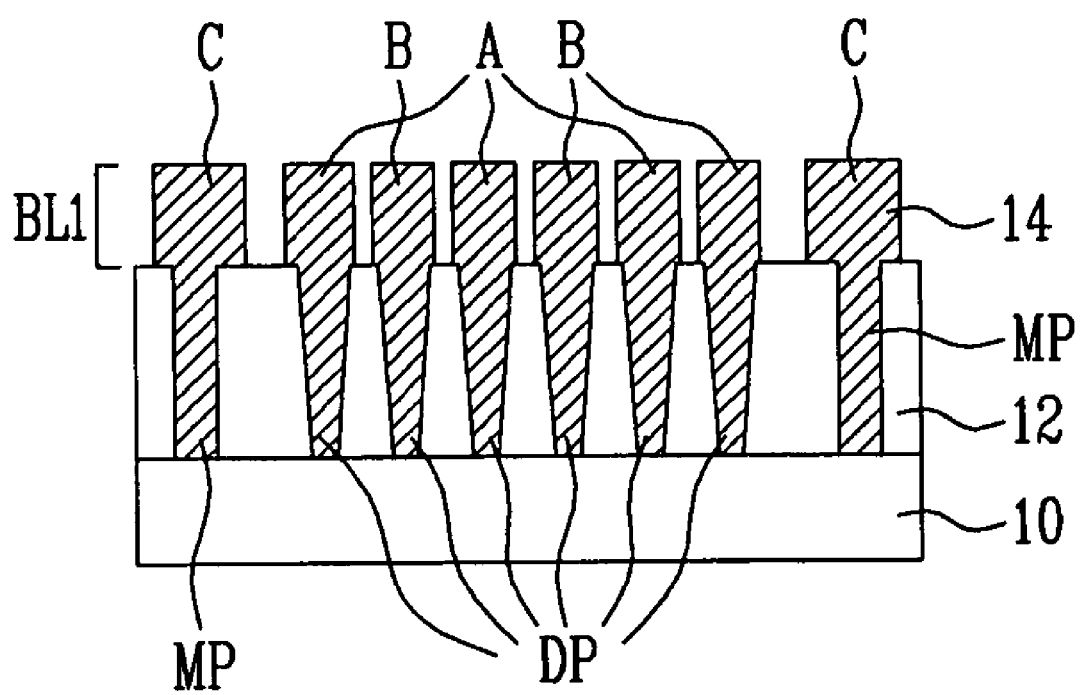
Figure 4A:
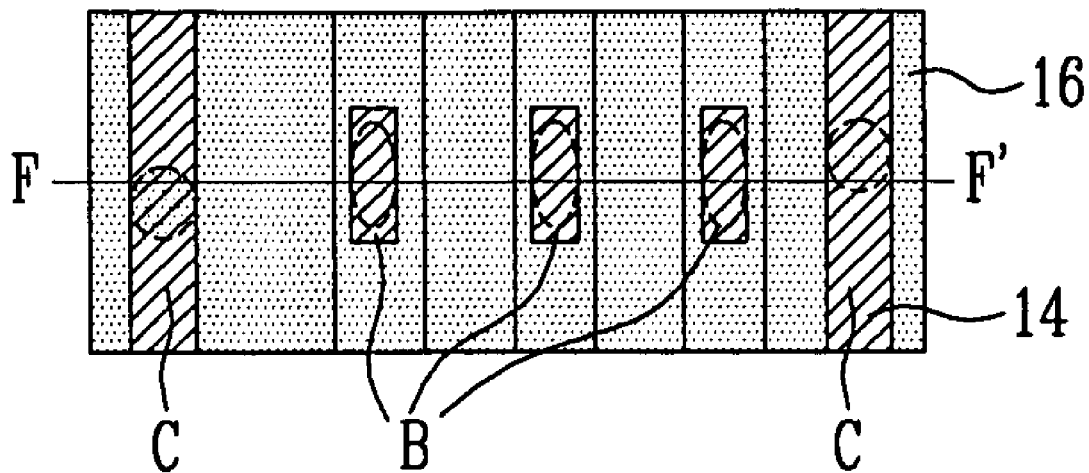
Figure 4B:
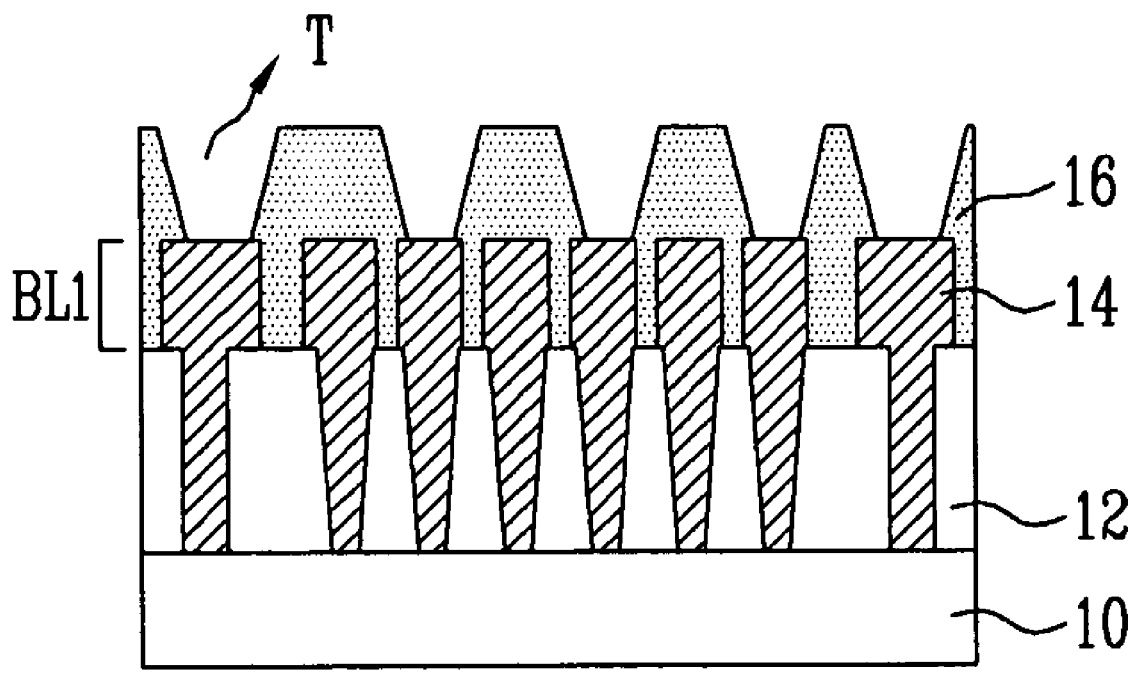
Figure 5A:
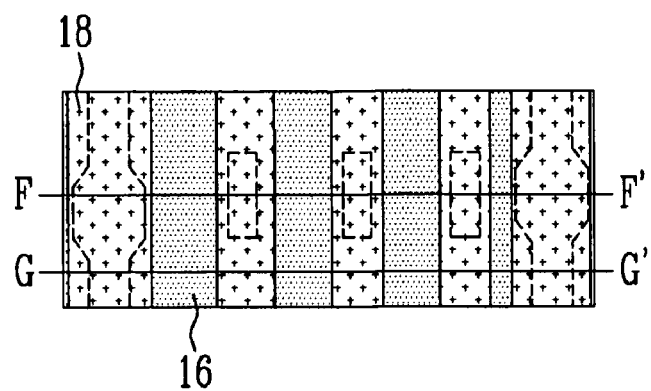
Figure 5B:
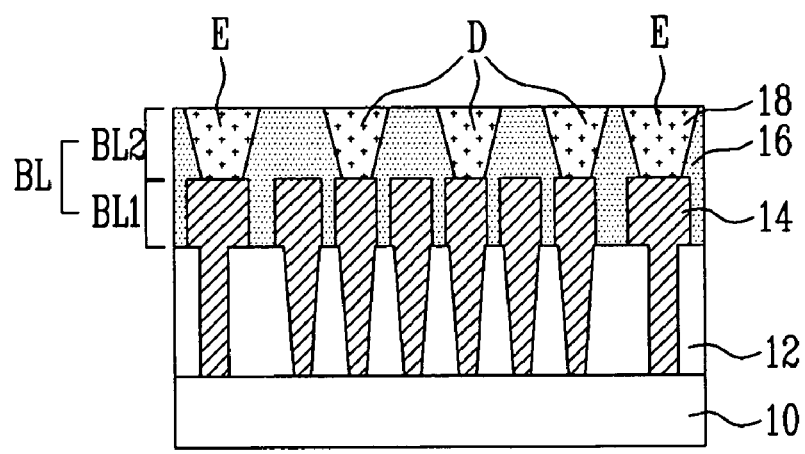
Figure 5C:
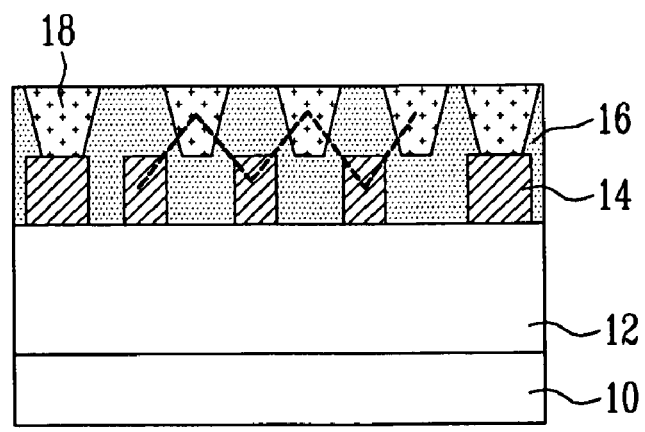

FIGS. 2A, 2B, 3A, 3B, 4A, 4B, 5A, 5B and 5C are cross-sectional views and layout diagrams illustrating a method of forming bit lines of a flash memory device according to a first embodiment of the present invention. FIGS. 2A, 3A, 4A, and 5A are layout diagrams illustrating the method of forming the bit lines of the flash memory device according to the first embodiment of the present invention. FIGS. 2B, 3B, 4B, and 5B are cross-sectional views of the flash memory devices taken along line F-F' of FIGS. 2A, 3A, 4A, and 5A. FIG. 5C is a cross-sectional view of the flash memory device taken along line G-G' of FIG. 5A.

Figure 1:
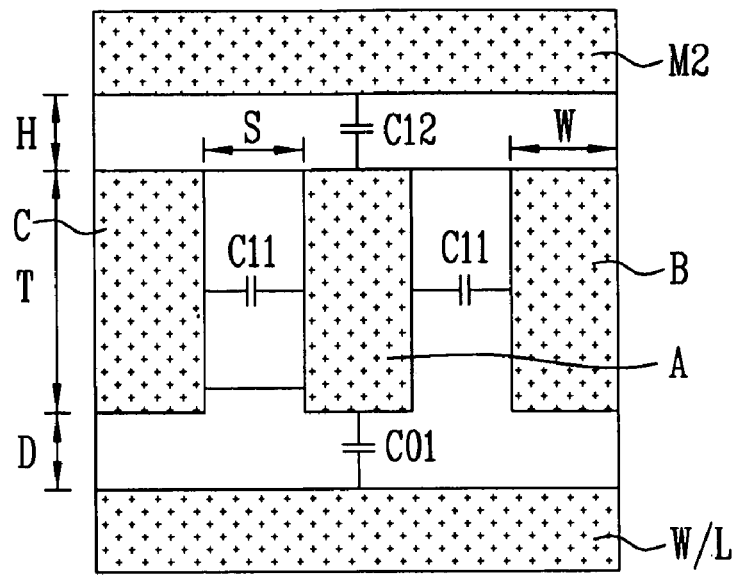
FIG. 1 is a cross-sectional view illustrating the problem of a reduction in pattern size between the bit lines of the flash memory device in the related art.
Figure 2A:
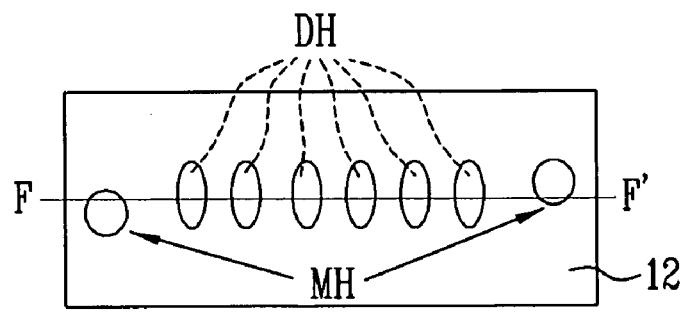
FIGS. 2A, 2B, 3A, 3B, 4A, 4B, 5A, 5B and 5C are cross-sectional views and layout diagrams illustrating a method of forming bit lines of a flash memory device according to a first embodiment of the present invention.
Figure 2B:
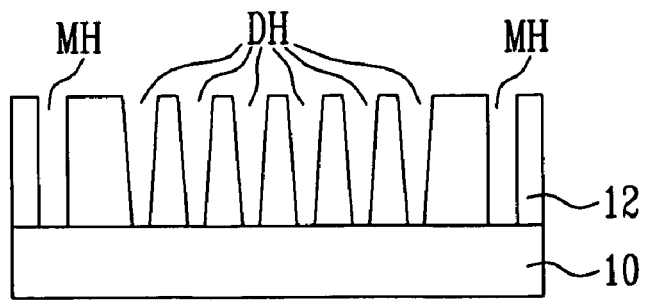

Referring to FIGS. 2A and 2B, a first interlayer insulating layer 12 is formed on a semiconductor substrate 10 in which a variety of elements, such as transistors and capacitors and including semiconductor elements, are formed. A photoresist pattern (not shown) for defining drain contact holes and metal line contact holes is formed in given regions of the first interlayer insulating layer 12.

An etch process using the photoresist pattern (not shown) as an etch mask is performed to form drain contact holes DH and metal line contact holes MH for forming drain contact plugs and bit line contact plugs, respectively.

During the process of forming the drain contact holes DH, the process of forming the metal line contact holes MH is carried out. Accordingly, two types of contact holes are formed at the same time through one etch process, thereby shortening the process number.

Referring to FIGS. 3A and 3B, first metal material 14 having a predetermined thickness is formed on the first interlayer insulating layer 12 and fills the drain contact holes DH and the metal line contact holes MH. The first metal material 14 that fills these holes define the drain contact plugs DP and the metal line contact plugs MP. Accordingly, the resistance of the drain contact plugs can be further reduced compared with the related art that use polysilicon to fill the drain contact holes. The unit process time and an overall process number can be reduced accordingly.

Thereafter, a photoresist pattern (not shown) is formed on the first interlayer insulating layer 12 to pattern the first metal material 14. An etch process using the photoresist pattern is performed to form a first metal layer BL1 including a plurality of metal lines that are connected to the metal plugs MP and DP.

The first metal material 14 may be any one of Al, W, Cu, or TiN formed by CVD, and a polysilicon layer by a furnace method.

The first metal layer BL1 include lines A that define odd-numbered bit lines M−1 and landing pads B that are part of even-numbered bit lines M-1 to be formed later (see FIG. 5B). The landing pads B are formed between the first metal lines A. The bit lines M-1 are the first metal level provided on or above the contact plugs DP and MP. The bit lines M-1 (or BL) includes the first metal layer BL1 and the second metal layer BL2, as will be explained later (see FIG. 5B).

The first metal layer BL1 also includes lines C that connect to the metal line contact plugs MP. The lines C are also configured to contact to the second metal layer to be formed subsequently.

As shown in FIG. 3A, the lines A provided adjacent to the landing pads B are concavely formed, so that they do not touch the landing pads B. A RIE (Reactive Ion Etch) process may be used to pattern the first metal material 14 and convert it into the first metal layer BL1.

The bit lines M-1 (or BL) having staggered odd-and-even numbered lines (see FIG. 5C) provide a line pitch size that is twice that of the conventional bit lines formed on a single level. The lines A define the odd-numbered bit lines M-1, and the landing pads B define a lower part of the even-numbered bit lines M-1. Accordingly, the pattern formation process can be facilitated during the forming of the bit lines M-1. The width of the bit lines M-1 can be increased, and line resistance can be reduced.

Referring to FIGS. 4A and 4B, a second interlayer insulating layer 16 is formed on the lines A, landing pads B, and lines C. The second interlayer insulating layer 16 may be formed using any one of BPSG, PSG, FSG, PE-TEOS, PE-SiH$_4$, HDP USG, and APL, and may be formed to be about 3000 to 4000 Å thicker than that of the first metal layer BL15A.

Thereafter, a photoresist pattern (not shown) is formed on the second interlayer insulating layer 16. The photoresist pattern is used to etch the second interlayer insulating layer 16 to define trenches T in which the second metal layer BL2 is to be provided therein. The landing pads B and lines C of the first metal layer BL1 are exposed by the trenches T, while the lines A remain covered by the second insulating layer 16 (see FIG. 4B).

During the trench etch process, the bottom CD of the trench is set to be smaller than the top CD of the trench to prevent electrical shorts between the lines A of the first metal layer BL1 and the lines D of the second metal layer BL2 (see FIG. 5A). The lines A correspond to the odd-numbered bit lines M-1, whereas the lines D contact the landing pads B to define the even-numbered bit lines M-1.

Referring to FIGS. 5A and 5B, second metal material 18 is formed on the second insulating layer 16 and filling the trenches T. A polishing process, such as CMP, is performed until the second interlayer insulating layer 16 is exposed and the second metal layer BL2 is defined within the trenches T.

The second metal layer BL2 include the lines D that contact the landing pads B and the lines E that contact the metal line contact plugs MP. The first and second metal layers BL1 and BL2 define the bit lines BL (or first metal level M-1)

Therefore, the formation of the bit lines BL (or M-1) is defined by the lines A and the lines D. The lines D are part of the even-numbered bit lines BL, and the lines A are part of the odd-numbered bit lines M-1.

As shown in FIG. 5C, the even-numbered bit lines M-1 (or the lines D) and the odd-numbered bit lines M-1 (or the lines A) are disposed in a zigzag arrangement and spaced apart from each other. Accordingly, the capacitance between the bit lines can be reduced while minimizing the distance between the bit lines. It is therefore possible to shorten the sensing time and reduce line resistance.

Figure 6A:
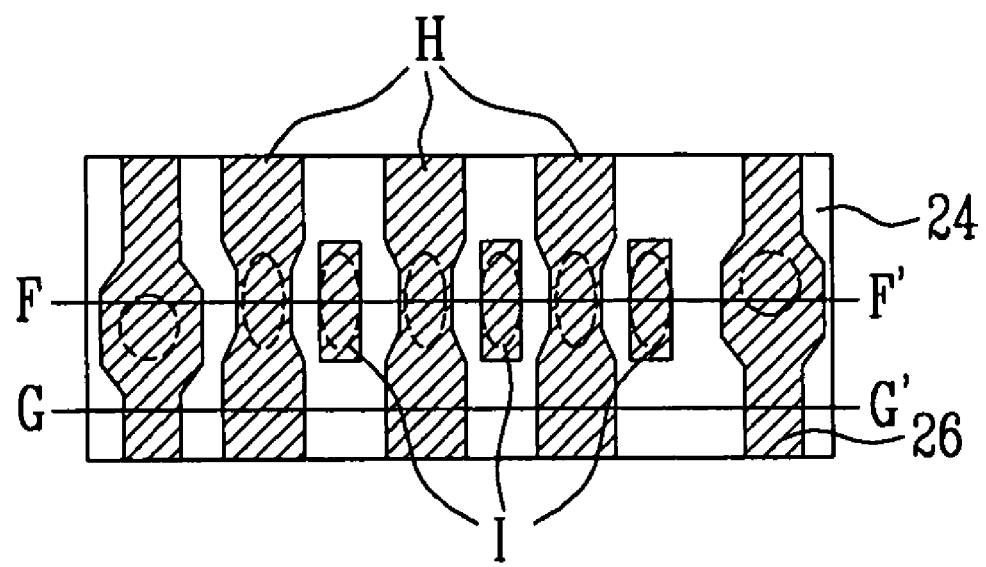
FIGS. 6A, 6B, 7A, 7B and 7C are cross-sectional views and layout diagrams illustrating a method of forming bit lines of a flash memory device according to a second embodiment of the present invention.
Figure 6B:
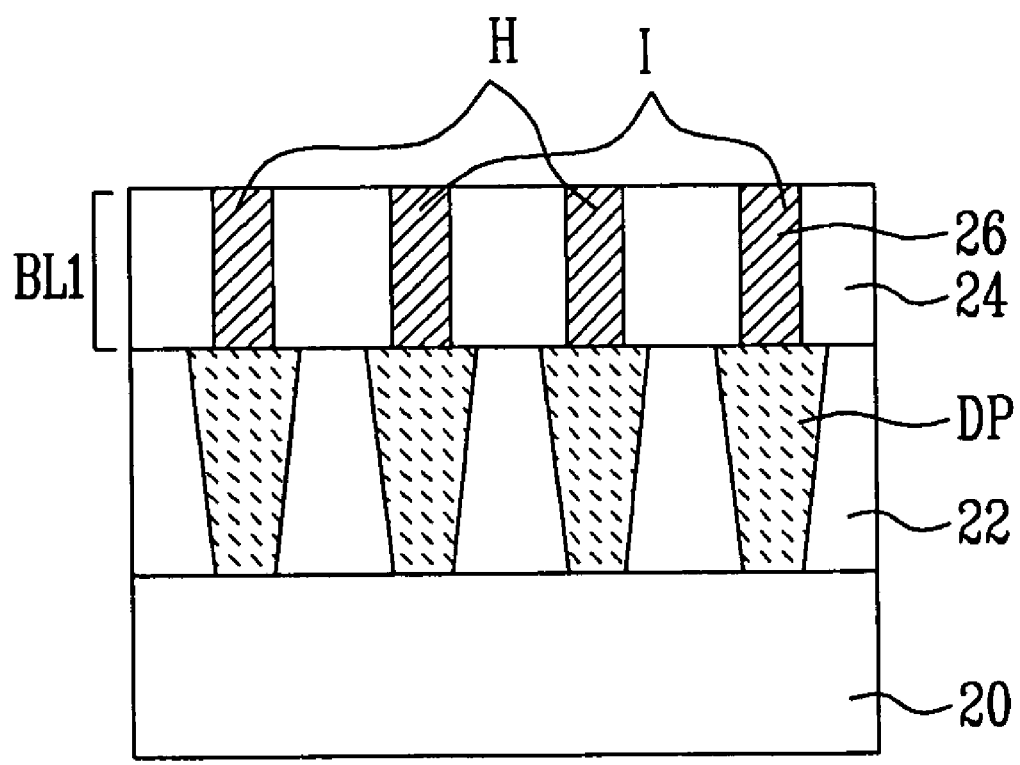
Figure 7A:
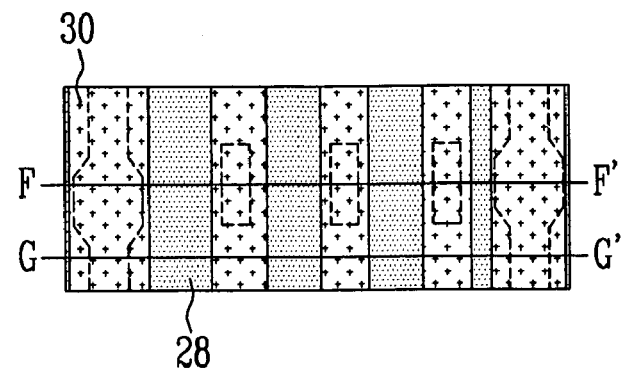
Figure 7B:
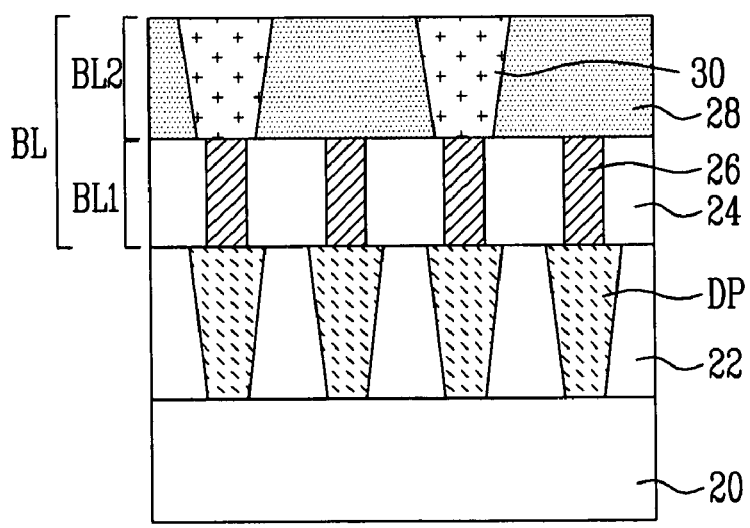
Figure 7C:
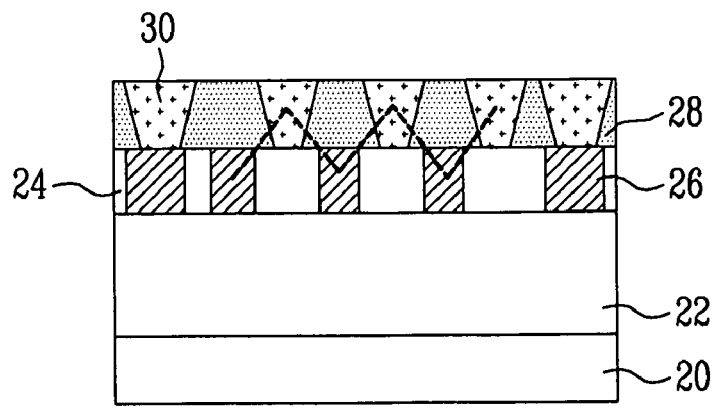

FIGS. 6A, 6B, 7A, 7B and 7C are cross-sectional views and layout diagrams illustrating a method of forming bit lines of a flash memory device according to a second embodiment of the present invention. FIGS. 6A and 7A are layout diagrams illustrating the method of forming the bit lines of the flash memory device according to the second embodiment of the present invention. FIGS. 6B and 7B are cross-sectional views of the flash memory devices taken along line F-F' of FIGS. 6A and 7A. FIG. 7C is a cross-sectional view of the flash memory device taken along line G-G' of FIG. 7A.

Referring to FIGS. 6A and 6B, a first interlayer insulating layer 22 is formed on a semiconductor substrate 20 whereon a variety of elements, such as, transistors and capacitors, are formed. A photoresist pattern (not shown) for forming drain contact holes is formed in given regions of the first interlayer insulating layer 22. The first insulating layer 22 is etched using the photoresist pattern (not shown) to form the drain contact holes.

Metal material (or conductive material) is formed on the first insulating material 22 and filling the drain contact holes. A polishing process, such as CMP, is then performed until the first interlayer insulating layer 22 is exposed and defining drain contact plugs DP.

A second interlayer insulating layer 24 is formed on the drain contact plugs DP. A photoresist pattern (not shown) is formed on the second interlayer insulating layer 24. The second insulating layer 24 is etched using the photoresist pattern to form trenches (not shown).

The trenches (not shown) in which the first metal layers will be formed are formed on the drain contact plugs DP in one to one relationship with the contact plugs DP (refer to FIG. 7A). One trench is formed on every two contact plugs DP on the cell transistors (refer to FIG. 7C).

To form a first metal layer, metal material is provided on the first insulating layer 24 and into the trenches (not shown). A polishing process, such as CMP, is performed until the second interlayer insulating layer 24 is exposed, thereby forming the first metal layer 26 within the trenches.

The first metal layer 26 is a first layer BL1 of the bit lines M-1. The first metal layer 26 (or BL1) includes lines H and landing pads I. The lines H define odd-numbered bit lines M-1. The landing pads I define a lower part of the even-number bit lines M-1 and are formed between the lines H.

As shown in FIG. 6B, the landing pads I are formed on upper regions in which the drain contact plugs DP are formed. The lines H are concavely formed so that they do not touch the adjacent landing pads I.

Referring to FIGS. 7A, 7B, and 7C, a third interlayer insulating layer 28 is formed on the first metal layer BL1. A photoresist pattern (not shown) is formed on the third interlayer insulating layer 28. The third insulating layer 28 is etched using the photoresist pattern to form trenches (not shown) in which the second metal layers will be formed. The landing pads I are exposed through the trenches (not shown).

For the trench formation process, the bottom CD of the trench is set to be smaller than the top CD of the trench to prevent electrical shorts between the first metal layer BL1 and the second metal layer BL2 (see FIGS. 7B and 7C).

Metal material is formed on the third insulating layer 28 and into the trenches to form the second metal layer BL2. A polishing process, such as CMP, is performed until the third interlayer insulating layer 28 is exposed, thereby forming the second metal layer 30. The second metal layer 30 is the second layer BL2 of the bit lines M-1 (or BL). The bit lines M-1 includes the lines H of the first metal layer BL1 and the second metal layer BL2. The lines H define the odd-numbered bit lines M-1, and the second metal layer BL2 defines the even-numbered bit lines M-1.

The odd-numbered bit lines (the lines H) and the even-number bit lines (the second metal layer BL2) are provided in a zigzag configuration and spaced apart from each other in the first and second layers (see FIG. 7C). Accordingly, the bit lines M−1 can be provided with an increased pitch size, the line resistance can be kept low, and the capacitance between the bit lines can be increased.

While the invention has been described in connection with specific embodiments, it is understood that the invention is not limited to the disclosed embodiments, but, is intended to cover various modifications and equivalent arrangements included within the spirit and scope of the appended claims.

What is claimed is:

1. A method of forming bit lines of a flash memory device, the method comprising:
    forming a plurality of first and second contact holes within an insulating layer that is provided over a semiconductor substrate;
    forming a plurality of first contact plugs in the first contact holes;
    forming a plurality of second contact plugs in the second contact holes;
    forming first metal lines coupled to the first contact plugs; and
    forming second metal lines coupled to the second contact plugs,
    wherein the first metal lines are parallel to the second metal lines, each second metal line being located between adjacent first metal lines, the first metal lines and the second metal lines being disposed at different heights from the semiconductor substrate, and
    wherein landing pads are formed between the first metal lines, and the second metal lines are coupled to the second contact plugs through the landing pads.

2. The method of claim 1, wherein the landing pads are islands provided adjacent to the first metal lines, so that the landing pads do not touch the first metal lines.

3. The method of claim 1, wherein the first metal lines have concave portions, so that the first metal lines do not touch the landing pads.

4. A method for forming a semiconductor device, the method comprising:
    forming a plurality of first contact holes and second contact holes in a first interlayer insulating layer provided over a semiconductor substrate;
    forming a metal layer over the first interlayer insulating layer including the first and second contact holes, wherein the metal layer formed in the first contact holes forms first contact plugs and the metal layer formed in the second contact holes forms second contact plugs;
    forming first metal lines and landing pads by patterning the metal layer over the first interlayer insulating layer, wherein the first metal lines are formed over the first insulating layer including the first contact plugs and the landing pads are formed at regions where the second contact plugs are formed;
    forming a second interlayer insulating layer over the semiconductor substrate including the first metal lines and the landing pads;
    forming a plurality of trenches in the second interlayer insulating layer, wherein the trenches expose the landing pads; and
    forming second metal lines in the trenches, the second metal lines being coupled to the second contact plugs through the landing pads, wherein the second metal lines are formed parallel to the first metal lines, each second metal line being located between adjacent first metal lines.

5. The method of claim 4, wherein the first metal lines and the second metal lines define bit lines of the device.

6. The method of claim 4, wherein the first metal lines and the second metal lines are arranged in a zigzag arrangement to increase a pitch of the bit lines.

7. The method of claim 4, wherein the landing pads are formed at upper regions of the second contact plugs so that the landing pads do not touch the first metal lines.

8. The method of claim 4, wherein the first contact holes and the second contact holes are alternatively formed in the first interlayer insulating layer.

9. The method of claim 4, wherein each of the trenches that exposes the landing pads has a bottom Critical Dimension (CD) that is smaller than a top CD.

10. The method of claim 4, further comprising:
    forming metal line contact holes at given regions of the first interlayer insulating layer at the same time that the first contact holes and the second contact holes are formed.

11. The method as claimed in claim 10, wherein the metal layer is used to define plugs within the first contact holes and the second contact holes.

12. The method of claim 4, wherein the metal layer is any one of Al, W, Cu, and TiN.

13. The method of claim 4, wherein the second interlayer insulating layer is any one of BPSG, PSG, FSG, PE-TEOS, PE-SiH4, HDP USG, and APL oxide films.

14. The method of claim 4, wherein the first metal lines and the second metal lines are in a zigzag arrangement.

* * * * *